(12) United States Patent
Liu et al.

(10) Patent No.: US 10,608,068 B2
(45) Date of Patent: Mar. 31, 2020

(54) OLED PANEL WITH A THIN PASSIVATION LAYER BELOW LIGHT EMITTING STRUCTURE

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventors: Zhaosong Liu, Guangdong (CN); Yuanjun Hsu, Guangdong (CN)

(73) Assignee: SHENZHEN CHINA STAR OPTOELECTRONICS SEMICONDUCTOR DISPLAY TECHNOLOGY CO., LTD., Shenzhen (CN)

(*) Notice: Subject to any disclaimer, the term of this patent is extended or adjusted under 35 U.S.C. 154(b) by 198 days.

(21) Appl. No.: 15/579,545

(22) PCT Filed: Nov. 20, 2017

(86) PCT No.: PCT/CN2017/111970
§ 371 (c)(1),
(2) Date: Dec. 4, 2017

(87) PCT Pub. No.: WO2019/080223
PCT Pub. Date: May 2, 2019

(65) Prior Publication Data
US 2019/0229172 A1 Jul. 25, 2019

(30) Foreign Application Priority Data
Oct. 23, 2017 (CN) .......................... 2017 1 0995248

(51) Int. Cl.
*H01L 29/08* (2006.01)
*H01L 33/00* (2010.01)
(Continued)

(52) U.S. Cl.
CPC .......... *H01L 27/3272* (2013.01); *H01L 21/77* (2013.01); *H01L 27/322* (2013.01);
(Continued)

(58) Field of Classification Search
CPC ... H01L 27/3272; H01L 21/77; H01L 27/322; H01L 27/3246; H01L 27/3258;
(Continued)

(56) References Cited

U.S. PATENT DOCUMENTS 10,121,830 B1 * 11/2018 Li ....................... H01L 27/3272
2011/0006306 A1 1/2011 Yamazaki et al.
(Continued)

FOREIGN PATENT DOCUMENTS

CN 103489824 1/2014
CN 104752344 7/2015
(Continued)

*Primary Examiner* — Alonzo Chambliss
(74) *Attorney, Agent, or Firm* — Hemisphere Law, PLLC; Zhigang Ma

(57) ABSTRACT

The present disclosure relates to an OLED panel and a manufacturing method thereof. The OLED panel includes: a glass substrate; a TFT light shielding layer; a buffer layer, a semiconductor layer; a patterned gate insulating layer; a patterned first metal layer; a interlayer insulating layer; a patterned second metal layer; a passivation layer deposited on the second metal layer by atomic layer deposition; a color filter; a planarization layer, wherein the planarization layer is provided with an opening structure corresponding to a storage capacitor area; an anode; a pixel defining layer; a light emitting layer; and a cathode. The present disclosure further provides a manufacturing method of an OLED panel thereof. The OLED panel and the manufacturing method thereof of the present disclosure can effectively increase the (Continued)

storage capacitance of the OLED panel, reduce the design area of the storage capacitor, and improve the panel aperture ratio.

11 Claims, 3 Drawing Sheets

(51) Int. Cl.
*H01L 31/0232* (2014.01)
*H01L 21/00* (2006.01)
*H01L 51/40* (2006.01)
*H01L 27/32* (2006.01)
*H01L 29/786* (2006.01)
*H01L 51/52* (2006.01)
*H01L 51/56* (2006.01)
*H01L 51/50* (2006.01)
*H01L 21/77* (2017.01)

(52) U.S. Cl.
CPC ...... *H01L 27/3246* (2013.01); *H01L 27/3258* (2013.01); *H01L 27/3262* (2013.01); *H01L 27/3265* (2013.01); *H01L 29/78693* (2013.01); *H01L 51/5012* (2013.01); *H01L 51/5237* (2013.01); *H01L 51/56* (2013.01)

(58) Field of Classification Search
CPC ............ H01L 27/3262; H01L 27/3265; H01L 29/78693; H01L 51/5012; H01L 51/5237; H01L 51/56
See application file for complete search history.

(56) References Cited

U.S. PATENT DOCUMENTS

| | | | |
|---|---|---|---|
| 2011/0108863 A1* | 5/2011 | Yamazaki | H01L 27/3211 257/88 |
| 2015/0014638 A1* | 1/2015 | Kwon | H01L 27/3265 257/40 |
| 2015/0069371 A1* | 3/2015 | Yamazaki | H01L 27/3211 257/40 |
| 2015/0187800 A1* | 7/2015 | Park | H01L 27/124 349/43 |
| 2015/0243661 A1* | 8/2015 | Matsumoto | H01L 21/823814 257/369 |
| 2016/0091742 A1* | 3/2016 | Chang | G02F 1/1362 257/43 |
| 2016/0118420 A1* | 4/2016 | Yang | H01L 27/1255 257/40 |
| 2017/0237033 A1* | 8/2017 | Koshihara | H01L 27/322 257/88 |
| 2018/0026112 A1* | 1/2018 | Park | H01L 29/42376 257/369 |

FOREIGN PATENT DOCUMENTS

| | | |
|---|---|---|
| CN | 105552083 A | 5/2016 |
| CN | 105867037 | 8/2016 |
| CN | 106257677 | 12/2016 |
| CN | 106920802 | 7/2017 |
| CN | 107170762 A | 9/2017 |

* cited by examiner

OLED PANEL WITH A THIN PASSIVATION LAYER BELOW LIGHT EMITTING STRUCTURE

RELATED APPLICATIONS

The present application is a National Phase of International Application Number PCT/CN2017/111970, filed on Nov. 20, 2017, and claims the priority of China Application 201710995248.X, filed on Oct. 23, 2017.

FIELD OF THE DISCLOSURE

The present disclosure relates to a display technology field, and more particularly to an OLED panel and a manufacturing method thereof.

BACKGROUND OF THE DISCLOSURE

Organic Light Emitting Display (OLED) has the advantages of self-luminous, low driving voltage, high luminous efficiency, short response time, sharpness and contrast, nearly 180° viewing angle, wide temperature range, flexible display and large-area full-color display. It is recognized as the most promising display device in the industry. According to the driving mode, the OLEDs can be divided into two types: a passive matrix OLED (PMOLED) and an active matrix OLED (AMOLED), namely direct addressing and thin film transistor (TFT) matrix addressing two categories. Wherein, AMOLED has a matrix arrangement of pixels, belonging to the active display type, high luminous efficiency, usually used for high-definition large-size display device.

The pixel driving circuit of the existing OLED panel generally includes a switch TFT, a driver TFT and a storage capacitor (Cst). The switch TFT is controlled by a scanning signal for controlling the data signal. The driver TFT is used for controlling the current passing through the OLED. The storage capacitor is generally used for storing the grayscale voltage to determine the driving current of the driver TFT.

As shown in FIG. 1, FIG. 1 is a structure diagram of the existing OLED panel. It can be divided by the function area into a switch TFT area, a driver TFT area and a storage capacitor area. The existing OLED panel mainly includes: a glass substrate 10; a light shielding layer (LS) 11 deposited on the glass substrate 10; a buffer layer 12 depositing on the light shielding layer 11; a semiconductor layer 13 deposited on the buffer layer 12, wherein the semiconductor layer 13 may be amorphous oxide semiconductor (AOS), and the area of the semiconductor layer 13 contacted with the TFT electrode can increase the doping concentration, for example, can form a N+ conductor layer; a gate insulating layer (GI) 14 deposited on the semiconductor layer 13; a first metal layer 15 (i.e. gate metal layer) deposited on the gate insulating layer 14 for forming a gate (G) of the TFT; an interlayer insulating layer (ILD) 16 deposited on the first metal layer 15; a second metal layer 17 (i.e. source-drain metal layer) deposited on the interlayer insulating layer 16, wherein the second metal layer 17 is pattered to partially form a source (S) and a drain (D) of the TFT and partially form a storage capacitor (corresponding to the storage capacitor area); a passivation layer (PV) 18 deposited on the second metal layer 17, wherein the passivation layer 18 in the prior art is generally made of SiOx; a color filter (CF-RGB) 19 formed on the passivation layer 18; a planarization layer (PLN) 40 formed on the color filter; an anode 41 deposited on the planarization layer 40, wherein the anode 41 may be a transparent oxide such as indium tin oxide (ITO); a pixel defining layer (PDL) 42 formed on the anode 41 for determining the light emitting area of the OLED device; a light emitting layer 43 formed on the anode 41 by vapor deposition or ink jet printing (IJP); and a cathode 44 formed on the light emitting layer 43. Others such as package structure will not be repeated here.

In the current top gate oxide TFT design, the storage capacitor is made of a structure of Indium Tin Oxide (ITO)-Metal 2-Amorphous Oxide Semiconductor (AOS). However, due to the interlayer between the Metal2 and the ITO is the passivation layer (PV) and the planarization layer (PLN) (shown in FIG. 1), the thickness of the two layers are larger. The storage capacitance is small when the area is the same. In order to achieve the need to increase the storage capacitance can only increase the area of the storage capacitor, it will seriously affect the aperture ratio.

SUMMARY OF THE DISCLOSURE

Therefore, an object of the present disclosure is to provide an OLED panel, which increases the storage capacitance of the OLED panel.

Another object of the present disclosure is to provide a manufacturing method of an OLED panel, which increases the storage capacitance of the OLED panel.

In order to achieve the above object, the present disclosure provides an OLED panel, including: a glass substrate; a TFT light shielding layer formed on the glass substrate; a buffer layer deposited on the TFT light shielding layer; a semiconductor layer deposited on the buffer layer; a TFT active layer formed by patterning the semiconductor; a patterned gate insulating layer and a patterned first metal layer deposited on the semiconductor an interlayer insulating layer deposited on the first metal layer, an opening of a source-drain contact area arranged on the interlayer insulating layer, a patterned second metal layer deposited on the interlayer insulating layer; a passivation layer deposited on the second metal layer by atomic layer deposition; a color filter, a planarization layer, an anode and a pixel defining layer formed on the passivation layer, an opening structure arranged on the planarization layer corresponding to a storage capacitor area; a light emitting layer formed on the anode; and a cathode formed on the light emitting layer; wherein the semiconductor layer other than an area of the first metal layer covered is treated by a conducting process, and the passivation layer is a film of a high dielectric constant material and is provided with a via hole.

Wherein a thickness of the passivation layer is less than 500 Å.

Wherein the high dielectric constant material is $Al_2O_3$.

The present disclosure further provides a manufacturing method of an OLED panel, including:

Step 1, providing a glass substrate, depositing a layer of metal on the glass substrate and patterning the layer of metal as a TFT light shielding layer;

Step 2, sequentially depositing a buffer layer and a semiconductor layer, and patterning the semiconductor layer as a TFT active layer;

Step 3, sequentially depositing a gate insulating layer and a first metal layer, patterning the gate insulating layer and the first metal layer, and conducting a conductor process on the semiconductor layer other than an area of the first metal layer covered;

Step 4, depositing an interlayer insulating layer, and forming an opening of a source-drain contact area on the interlayer insulating layer;

Step 5, depositing a second metal layer, and patterning the second metal layer;

Step 6, depositing a film of a high dielectric constant material as a passivation layer by atomic layer deposition, and etching a via hole;

Step 7, sequentially forming a color filter, a planarization layer, an anode and a pixel defining layer, wherein the planarization layer has a via hole corresponding to the passivation layer and is an opening structure at the storage capacitor area; and Step 8, forming a light emitting layer and a cathode.

Wherein a thickness of the passivation layer is less than 500 Å.

Wherein the high dielectric constant material is $Al_2O_3$.

Wherein the material of the TFT light shielding layer is Mo, Al, Cu, Ti or alloy.

Wherein the buffer layer is a SiOx film, a SiNx film or a laminated structure film.

Wherein the material of the semiconductor layer is amorphous oxide semiconductor.

Wherein the material of the semiconductor is IGZO, IZTO or IGZTO.

The present disclosure further provides an OLED panel, including: a glass substrate; a TFT light shielding layer formed on the glass substrate; a buffer layer deposited on the TFT light shielding layer; a semiconductor layer deposited on the buffer layer; a TFT active layer formed by patterning the semiconductor; a patterned gate insulating layer and a patterned first metal layer deposited on the semiconductor; an interlayer insulating layer deposited on the first metal layer; an opening of a source-drain contact area arranged on the interlayer insulating layer a patterned second metal layer deposited on the interlayer insulating layer a passivation layer deposited on the second metal layer by atomic layer deposition; a color filter, a planarization layer, an anode and a pixel defining layer formed on the passivation layer; an opening structure arranged on the planarization layer corresponding to a storage capacitor area; a light emitting layer formed on the anode; and a cathode formed on the light emitting layer wherein the semiconductor layer other than an area of the first metal layer covered is treated by a conducting process, the passivation layer is a film of a high dielectric constant material and is provided with a via hole; a thickness of the passivation layer is less than 500 Å; and the high dielectric constant material is $Al_2O_3$.

In summary, the OLED panel and the manufacturing method thereof of the present disclosure can effectively increase the storage capacitance of the OLED panel, reduce the design area of the storage capacitor, and improve the aperture ratio of the panel.

BRIEF DESCRIPTION OF THE DRAWINGS

The technical solutions of the present disclosure and other beneficial effects will be apparent from the following detailed description of specific embodiments of the present disclosure with reference to the accompanying drawings.

DETAILED DESCRIPTION OF PREFERRED EMBODIMENTS

Figure 1:
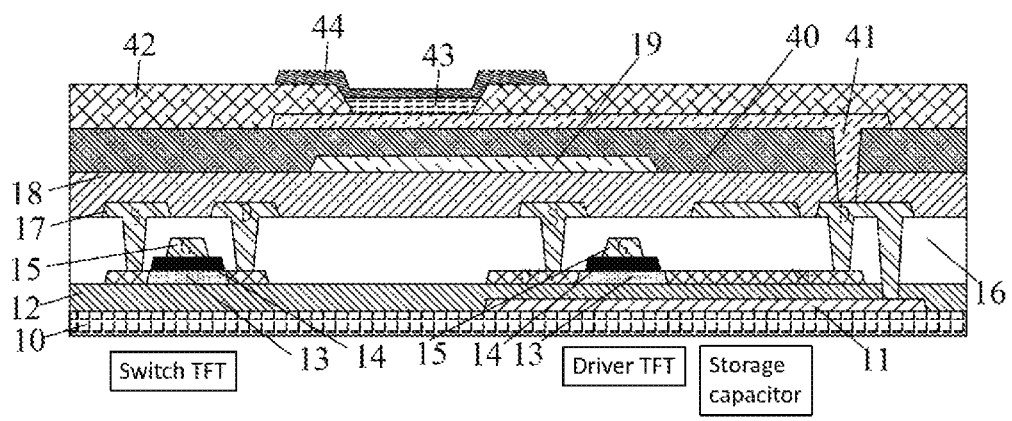
FIG. 1 is a structure diagram of the existing OLED panel.
Figure 2:
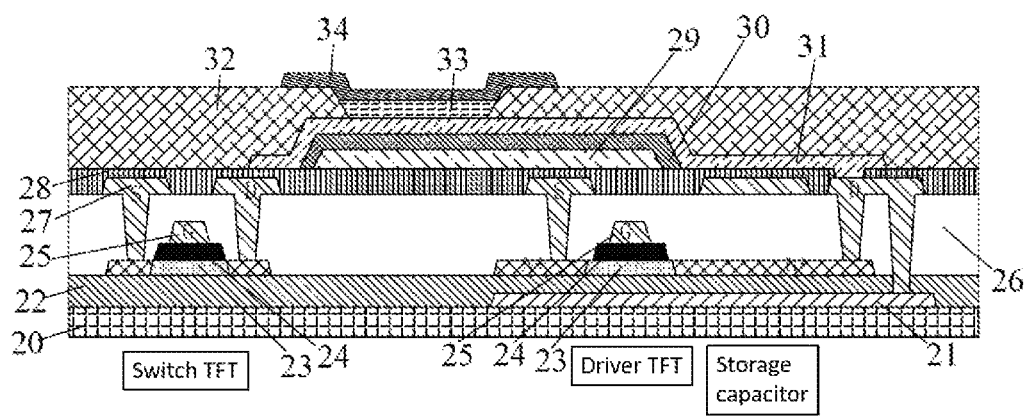
FIG. 2 is a schematic structural diagram of a preferred embodiment of the OLED panel of the present disclosure.

Refer to FIG. 2, FIG. 2 is a schematic structural diagram of a preferred embodiment of the OLED panel of the present disclosure. It can be divided by the function area into a switch TFT area, a driver TFT area and a storage capacitor area. The OLED panel of the present disclosure mainly includes: a glass substrate 20; a TFT light shielding layer 21 formed on the glass substrate 20; a buffer layer 22 deposited on the TFT light shielding layer 21; a semiconductor layer 23 deposited on the buffer layer 22, wherein the semiconductor layer 23 is serves as a TFT active layer by patterning; a gate insulating layer 24 and a first metal layer 25 deposited on the semiconductor layer 23, wherein a gate of the TFT is formed by patterning the gate insulating layer 24 and the first metal layer 25, and the semiconductor layer 23 other than the area of the first metal layer 25 covered is treated by conductor process, for example, a N+ conductor layer can be formed by increasing the doping concentration in an area of the semiconductor layer 23 contacted with the TFT electrode; a interlayer insulating layer 26 deposited on the first metal layer 25, and an opening of the source-drain contact area arranged on the interlayer insulating layer 26; a second metal layer 27 deposited on the interlayer insulating layer 26, wherein the second metal layer 27 is patterned to partially form a source (S) and a drain (D) of the TFT and partially form a storage capacitor (corresponding to the storage capacitor area); a passivation layer 28 deposited on the second metal layer 27 by ALD, wherein the passivation layer 28 is a film of the high dielectric constant material and is provided with a via hole; a color filter 29, a planarization layer 30, an anode 31 and a pixel defining layer 32 formed on the passivation layer 28, wherein a via hole of the planarization layer 30 is provided corresponding to the via hole of the passivation layer 28, and is an opening structure at the storage capacitor area; a light emitting layer 33 formed on the anode 31; and a cathode 34 formed on the light emitting layer 33. Other conventional packaging structures will not be repeated here.

In order to increase the storage capacitance of the OLED panel, reduce the design area of the storage capacitor, and increase the aperture ratio of the panel, the thickness of the passivation layer 28 can be designed to be less than 500 Å, and the material of the high dielectric constant (high-k) material used may be $Al_2O_3$.

In order to solve the problems existing in the prior art, the disclosure starts with two aspects of design and process selection. On the one hand, the PV layer is made of high-k material, such as $Al_2O_3$, and adopts a well-covered deposition method to drastically reduce the thickness of the PV to further increase the storage capacitance. On the other hand, the original PLN design was changed to a method of forming an opening on the PLN at the storage capacitor to reduce the impact of PLN. The present disclosure can effectively improve the storage capacitance, thereby reducing the design area of the storage capacitor and greatly improving the aperture ratio.

Refer to FIG. 3A to FIG. 3H, FIG. 3A to FIG. 3H are schematic flow charts of a preferred embodiment of the manufacturing method of an OLED panel according to the present disclosure. Due to the PV material, the process improvement and the change of the PLN design, the manufacturing method of the OLED panel of the present disclosure mainly includes the following steps:

Step 1, providing a glass substrate, depositing a layer of metal on the glass substrate and patterning the layer of metal as a TFT light shielding layer.

Figure 3A:
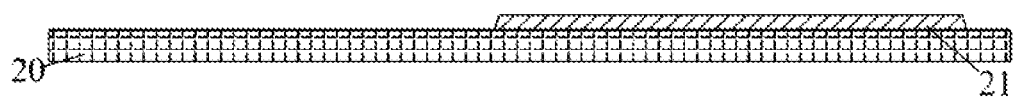
FIG. 3A to FIG. 3H are schematic flow charts of a preferred embodiment of the manufacturing method of an OLED panel according to the present disclosure.

Referring to FIG. 3A, cleaning the glass substrate 20, depositing a layer of metal with a thickness of 500-2000 Å, patterning the layer of metal as a TFT light shielding layer 21 by photolithography process and etching, wherein the layer of metal may be Mo, Al, Cu, Ti or alloy.

Step 2, sequentially depositing a buffer layer and a semiconductor layer, and patterning the semiconductor layer as a TFT active layer.

Figure 3B:
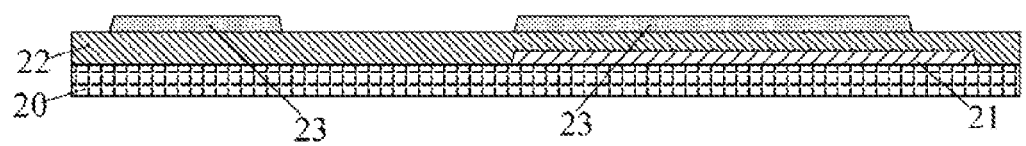

Referring to FIG. 3B, depositing a film as a buffer layer 22, wherein the buffer layer 22 can be a SiOx, SiNx single layer thin film or a stacked structure, and the thickness may be 1000-5000 Å; depositing a layer of metal oxide semiconductor material as a semiconductor layer 23, wherein the semiconductor layer 23 may be made of an amorphous oxide semiconductor (AOS) material, which may be IGZO, IZTO, IGZTO or the like, and the thickness may be 100-1000 Å; and forming an active layer by patterning the semiconductor layer 23.

Step 3, sequentially depositing a gate insulating layer and a first metal layer, patterning the gate insulating layer and the first metal layer, and conducting a conductor process on the semiconductor layer other than an area of the first metal layer covered.

Figure 3C:
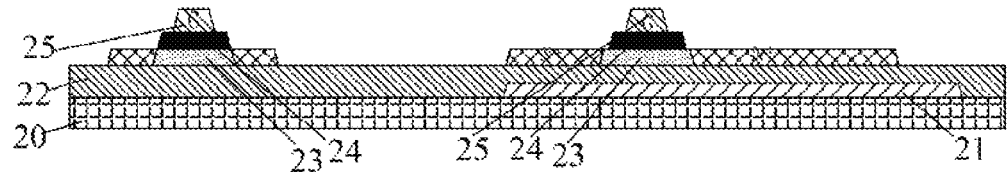

Referring to FIG. 3C, depositing a layer of gate insulating layer 24, wherein the layer of gate insulating layer 24 may be a SiOx, SiNx single layer thin film or a stacked structure, and the thickness is 1000-3000 Å; depositing a layer of metal as a first metal layer 25 (i.e. gate metal layer), wherein the first metal layer 25 may be Mo, Al, Cu, Ti or alloy, the thickness is 2000-8000 Å; etching the first metal layer 25 to etch the patter of the gate metal by photolithography process, then etching the gate insulating layer 24 by aligning the pattern of the gate metal, wherein the gate insulating layer 24 exists only under the layer of the gate metal pattern, and the remaining gate insulating layer 24 is etched away; performing the entire surface of the plasma treatment to reduce the oxide resistance of the top without protected by the gate insulating layer 24 and the gate metal significantly; and forming a N+ conductive layer as a source-drain (S/D) contact area. Wherein the oxide under the gate insulating layer 24 is not processed to maintain the semiconductor characteristics as a TFT channel.

Step 4, depositing an interlayer insulating layer, and forming an opening of a source-drain contact area on the interlayer insulating layer.

Figure 3D:
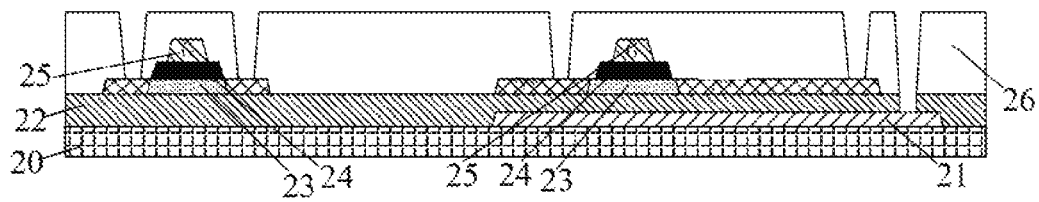

Referring to FIG. 3D, wherein the interlayer insulating layer 26 may be a SiOx, SiNx single layer thin film or a stacked structure, the thickness is 3000-10000 Å, and an opening of the source-drain (S/D) contact area is formed by photolithography process.

Step 5, depositing a second metal layer, and patterning the second metal layer.

Figure 3E:
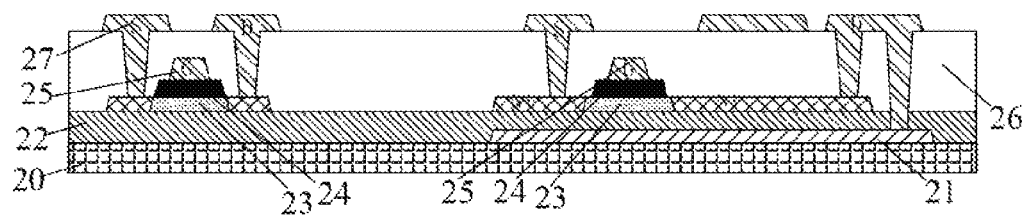

Referring to FIG. 3E, depositing a layer of metal as the second metal layer 27 (i.e. source-drain metal layer), wherein the second metal layer 27 may be Mo, Al, Cu, Ti or alloy, the thickness is 2000-8000 Å, a pattern is defined by photolithography process and etch to partially form a source (S) and a drain (D) of the TFT and partially form a storage capacitor (corresponding to the storage capacitor area).

Step 6, depositing a film of a high dielectric constant material as a passivation layer by atomic layer deposition, and etching a via hole.

Figure 3F:
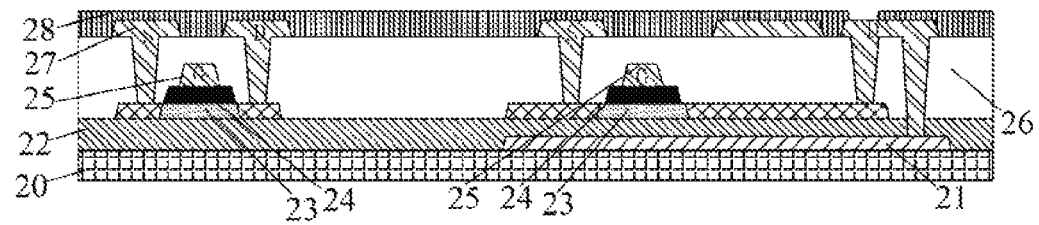

Referring to FIG. 3F, depositing a passivation layer 28, wherein the passivation layer 28 is deposited by ALD, the material may be a high-K material such as $Al_2O_3$, the thickness is designed to be very thin, may less than 500 Å, and the via hole is etched by photolithography process.

Step 7, sequentially forming a color filter, a planarization layer, an anode and a pixel defining layer, wherein the planarization layer has a via hole corresponding to the passivation layer and is an opening structure at the storage capacitor area.

Figure 3G:
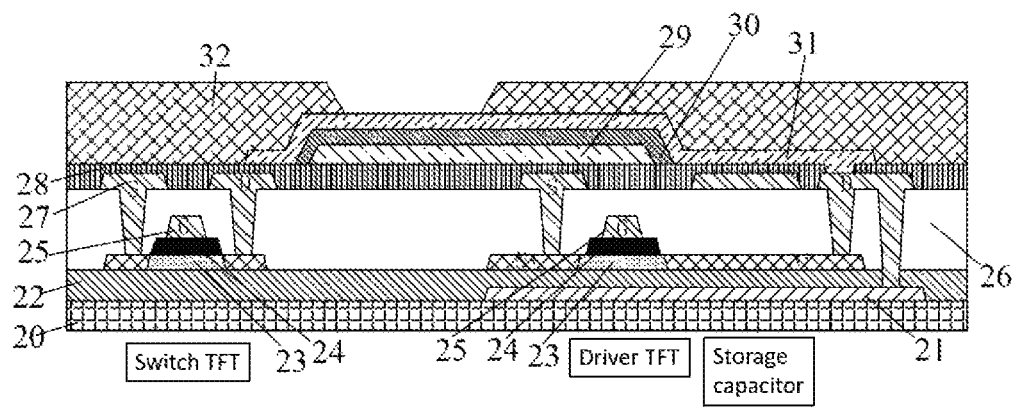

Referring to FIG. 3G, forming the color filter 29; forming the planarization layer 30, wherein the planarization layer 30 may be a photoresist layer with different compositions and has a thickness of 10000-20000 Å, a via hole is formed by photolithography process, and an opening structure is arranged in the storage capacitor area; forming an anode 31, wherein the anode 31 may be a transparent oxide such as ITO, and the thickness is 500-1000 Å; forming a pixel defining layer 32, wherein the pixel defining layer 32 may be a photoresist layer with different compositions and has a thickness of 10000-20000 Å; and defining a light emitting area by photolithography process to complete the backplane fabrication.

Step 8, forming a light emitting layer and a cathode.

Figure 3H:
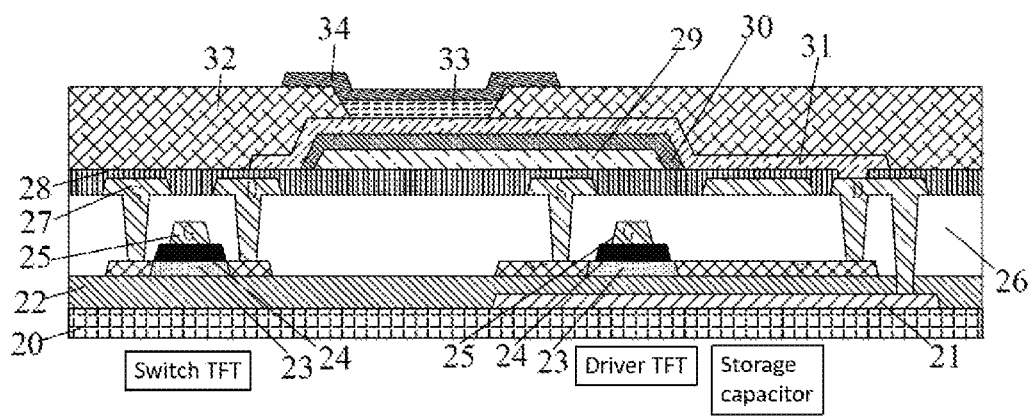

Referring to FIG. 3H, forming the light emitting layer 33 by vapor deposition or ink jet printing (IJP), and then forming the cathode 34 to complete the manufacture of the OLED panel.

In the manufacturing method of an OLED panel of the present disclosure, the PV using the high-K material such as $Al_2O_3$, and depositing by ALD, which can significantly reduce the thickness of the PV and increase the storage capacitance. The design of the PLN layer adopts the way of opening the storage capacitor area to reduce the distance between the two electrodes and increase the storage capacitance.

In summary, the OLED panel and the manufacturing method thereof of the present disclosure can effectively increase the storage capacitance of the OLED panel, reduce the design area of the storage capacitor, and improve the aperture ratio of the panel.

It should be understood by those skilled in the art that various modifications and variations can be made in the light of the technical solutions and technical concepts of the present disclosure. All such changes and modifications shall fall within the protection scope of the appended claims of the present disclosure.

What is claimed is:

1. An OLED panel, comprising: a glass substrate; a TFT light shielding layer formed on the glass substrate; a buffer layer deposited on the TFT light shielding layer; a semiconductor layer deposited on the buffer layer; a TFT active layer formed by patterning the semiconductor; a patterned gate insulating layer and a patterned first metal layer deposited on the semiconductor; an interlayer insulating layer deposited on the first metal layer; an opening of a source-drain contact area arranged on the interlayer insulating layer; a patterned second metal layer deposited on the interlayer insulating layer; a passivation layer deposited on the second metal layer by atomic layer deposition; a color filter, a planarization layer, an anode and a pixel defining layer formed on the passivation layer; an opening structure arranged on the planarization layer corresponding to a storage capacitor area, an area of the planarization layer is less than an area of the anode; a light emitting layer formed on the anode; and a cathode formed on the light emitting layer; wherein the semiconductor layer other than an area of the first metal layer covered is treated by a conducting process, and the passivation layer is a film of a high dielectric constant material and is provided with a via hole.

2. The OLED panel according to claim 1, wherein a thickness of the passivation layer is less than 500 Å.

3. The OLED panel according to claim 1, wherein the high dielectric constant material is $Al_2O_3$.

4. A manufacturing method of an OLED panel, comprising:
- Step 1, providing a glass substrate, depositing a layer of metal on the glass substrate and patterning the layer of metal as a TFT light shielding layer;
- Step 2, sequentially depositing a buffer layer and a semiconductor layer, and patterning the semiconductor layer as a TFT active layer;
- Step 3, sequentially depositing a gate insulating layer and a first metal layer, patterning the gate insulating layer and the first metal layer, and conducting a conductor process on the semiconductor layer other than an area of the first metal layer covered;
- Step 4, depositing an interlayer insulating layer, and forming an opening of a source-drain contact area on the interlayer insulating layer;
- Step 5, depositing a second metal layer, and patterning the second metal layer;
- Step 6, depositing a film of a high dielectric constant material as a passivation layer by atomic layer deposition, and etching a via hole;
- Step 7, sequentially forming a color filter, a planarization layer, an anode and a pixel defining layer, wherein the planarization layer has a via hole corresponding to the passivation layer and is an opening structure at the storage capacitor area, an area of the planarization layer is less than an area of the anode; and
- Step 8, forming a light emitting layer and a cathode.

5. The manufacturing method of an OLED panel according to claim 4, wherein a thickness of the passivation layer is less than 500 Å.

6. The manufacturing method of an OLED panel according to claim 4, wherein the high dielectric constant material is $Al_2O_3$.

7. The manufacturing method of an OLED panel according to claim 4, wherein the material of the TFT light shielding layer is Mo, Al, Cu, Ti or alloy.

8. The manufacturing method of an OLED panel according to claim 4, wherein the buffer layer is a SiOx film, a SiNx film or a laminated structure film.

9. The manufacturing method of an OLED panel according to claim 4, wherein the material of the semiconductor layer is amorphous oxide semiconductor.

10. The manufacturing method of an OLED panel according to claim 9, wherein the material of the semiconductor is IGZO, IZTO or IGZTO.

11. An OLED panel, comprising: a glass substrate; a TFT light shielding layer formed on the glass substrate; a buffer layer deposited on the TFT light shielding layer; a semiconductor layer deposited on the buffer layer; a TFT active layer formed by patterning the semiconductor; a patterned gate insulating layer and a patterned first metal layer deposited on the semiconductor; an interlayer insulating layer deposited on the first metal layer; an opening of a source-drain contact area arranged on the interlayer insulating layer; a patterned second metal layer deposited on the interlayer insulating layer; a passivation layer deposited on the second metal layer by atomic layer deposition; a color filter, a planarization layer, an anode and a pixel defining layer formed on the passivation layer; an opening structure arranged on the planarization layer corresponding to a storage capacitor area, an area of the planarization layer is less than an area of the anode; a light emitting layer formed on the anode; and a cathode formed on the light emitting layer; wherein the semiconductor layer other than an area of the first metal layer covered is treated by a conducting process, the passivation layer is a film of a high dielectric constant material and is provided with a via hole, a thickness of the passivation layer is less than 500 Å, and the high dielectric constant material is $Al_2O_3$.

* * * * *